June 29, 1965 G. R. REID 3,192,136

METHOD OF PREPARING PRECISION SCREENS

Filed Sept. 14, 1962

INVENTOR.
GILBERT R. REID
BY
Thomas J. Moran
ATTORNEY

United States Patent Office 3,192,136
Patented June 29, 1965

3,192,136
METHOD OF PREPARING PRECISION SCREENS

Gilbert R. Reid, Camden, N.J., assignor to Sperry Rand Corporation, New York, N.Y., a corporation of Delaware Filed Sept. 14, 1962, Ser. No. 223,701
7 Claims. (Cl. 204—11)

This invention relates to precision screens and masks and methods of preparation, and more particularly to precision screens and masks and methods of preparation by electroforming and selective etching.

Heretofore, it has been impossible to produce masks and screens of substantial rigidity and structural integrity incorporating the high degree of accuracy required by present-day industry. The development of precision screens and masks has not kept pace with the advances in technology in the electronics industry, particularly that branch of the electronics industry dealing with printed circuits and the like.

It is, therefore, an object of the invention to provide improved precision screens and masks.

Another object of the invention is to provide precision screens and masks of high accuracy.

Another object of the invention is to provide precision screens and masks of substantial rigidity and structural integrity.

Another object of the invention is to provide an improved method of preparing precision screens and masks.

Another object of the invention is to provide a method of preparing precision screens and masks of high accuracy.

Another object of the invention is to provide a method of preparing precision screens and masks of substantial rigidity and structural integrity.

Another object of the invention is to provide a method of preparing precision screens and masks by electroforming and selective etching.

The objects of the invention are accomplished by first coating a substrate with an electrically conductive material or otherwise providing a substrate having an electrically conductive surface, and then coating the electrically conductive surface material with a photo resist or similar light sensitive material. A desired pattern, the negative of the pattern to be formed, is then printed on the photo resist coating and a first image developed. The non-exposed photo resist material is then washed away. The photo resist material which is washed away is replaced by electroforming or electrodepositing on the uncoated electrically conductive surface of the substrate a suitable selectively etch-resistant metal, such as nickel. The remaining photo resist material is then removed, and the entire surface is electroplated with a selectively etchable metal, such as copper.

The surface of the etchable metal is then coated with photo resist material and the desired pattern is again printed on the surface of the photo resist material and a second image developed as described above. The second image corresponds to and is coextensive in design and area with respect to said first image. Alignment with the first pattern is insured by register pins protruding from the substrate. The non-exposed photo resist material is again washed away.

The photo resist material which is washed away is replaced by electroforming or electrodepositing, on the uncoated surface of the selectively etchable metal, a suitable etch resistant metal, such as nickel. The remaining photo resist is removed, and the resulting sandwish structure composed of a layer of selectively etchable metal, copper, between two layers of selectively etch resistant metal, nickel, is removed from the substrate. Etching fluid is used to etch out the selectively etchable metal to develop the desired pattern therein, the same as the pattern already developed in the two electroformed etch-resistant layers.

Figure 1:
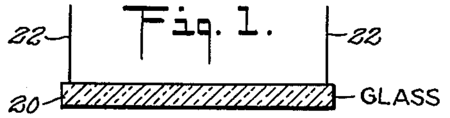
FIGS. 1 through 11 illustrate successive steps in the process of this invention.
Figure 2:

Other objects and a fuller understanding of the invention may be had by referring to the following description and claims taken in conjunction with the accompanying drawing in which:

*FIGS. 1 and 2*

FIGS. 1 and 2 illustrate the first step in the preparation of a screen or mask in accordance with this invention. A substrate, such as a glass substrate 20 is coated with a conductive material 21, such as silver. Register pins 22 are provided and protrude from the top of substrate 20. Substrate 20 is a flat plate, and may be composed of various materials, conductive or non-conductive. If substrate 20 is made of conductive material, such as stainless steel, the operation of providing a conductive surface or layer thereon, such as a layer of silver, is unnecessary and may be omitted.

*FIGS. 3 through 6*

Figure 3:
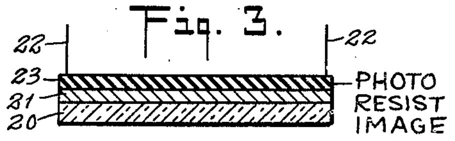
Figure 4:
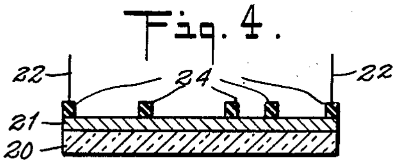

Beginning with FIG. 3, photo resist material 23 is coated on top of the conductive material 21 on substrate 20. A negative of the desired pattern to be incorporated in the finished screen or mask is printed on the surface of the photo resist 23 by the photo-graphic process of exposing photo resist material 23 to light representing the desired pattern. The image 24 thus imprinted on the photo-resistant material is developed as shown in FIG. 4, the non-exposed photo resist 23 having been washed away with a solvent, the exposed photo resist material being insoluble in the solvent employed for developing the image.

Figure 5:
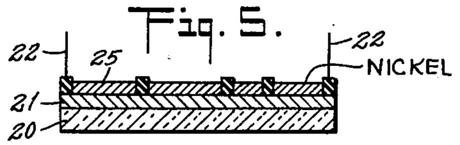
Figure 6:
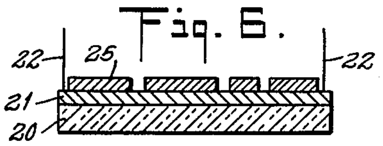

Photo resist material 23 which is washed away, thereby uncovering substrate 20 and conductive material 21 thereon, is replaced by selectively etch-resistant material 25, such as nickel, as shown in FIG. 5, by electroforming, with the conductive material 21 serving as the electrode for the deposition of each-resistant material 25 thereon. Selectively etch-resistant material 25 may be nickel, plated to a thickness of from 0.0005 to 0.0010 of an inch but to a thickness not greater than the thickness of the remaining photo resist material 23. Remaining photo resist 23 is then removed by means of a suitable solvent leaving the selectively etch-resistant material 25 on substrate 20.

*FIG. 7*

Figure 7:
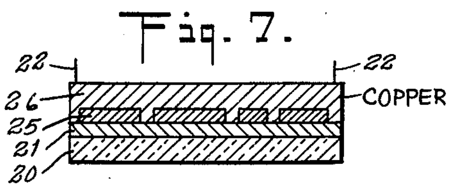

In FIG. 7, selectively etchable material 26 is electrodeposited onto selectively etch-resistant material 25. Etchable material 26 may be copper, plated to a thickness of from 0.001 to 0.010″ depending on the thickness desired in the finished screen or mask. Etchable material 26, such as copper, is deposited to a thickness to provide structural integrity in the finished screen. The thickness of etchable material 26 is such as to completely cover the previously deposited etch-resistant material 25 which has the desired pattern incorporated therein.

Figure 8:
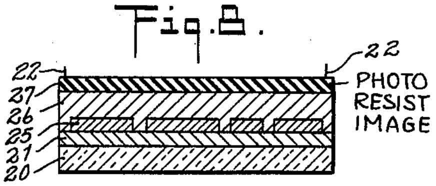
Figure 9:
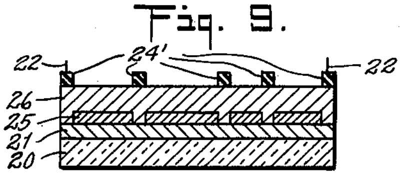

In FIGS. 8 through 11, the processes described with respect to FIGS. 3 through 6 are repeated on top of the etchable material 26. In FIG. 8, photo resist 27 is coated on top of the etchable material 26. A negative of the desired pattern is printed on the surface of the photo resist 27, and the image 24′ is developed as shown in FIG.

9, the non-exposed photo resist 27 being washed away with a solvent. Register pins 22 insure alignment of image 24' with the first image 24.

Figure 10:
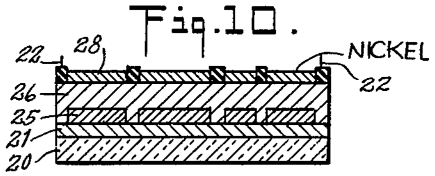
Figure 11:
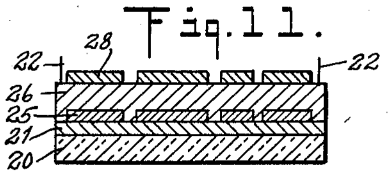

The photo resist 27 which is washed away is replaced by a selectively etch-resistant material 28, as shown in FIG. 10, by electroforming. Etching resistant material 28 may again be nickel, plated to a suitable thickness, such as a thickness in the range, but not greater than the thickness of the photo resist material 27, of from 0.0005–0.0010". The remaining photo resist 27 is removed by means of a suitable solvent leaving only the etch-resistant material 28 incorporating image 24' as shown in FIG. 11.

*FIG. 12*

Figure 12:
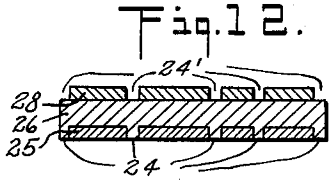
FIG. 12 is a section through a precision screen or mask prepared in accordance with this invention after stripping from the substrate.

The three layers of plating comprising selectively etchable material 26 sandwiched between selectively etch-resistant material 25 and 28 are stripped from the substrate 20 leaving conductive material 21 on the substrate. The resulting stripped product is shown in FIG. 12.

Figure 13:
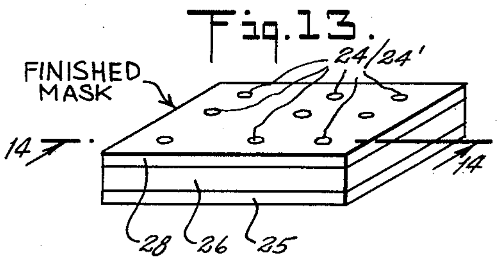
FIG. 13 is a perspective view of a finished precision screen or mask.
Figure 14:
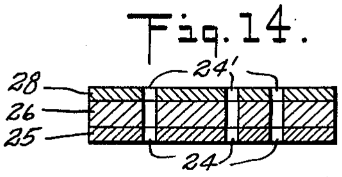
FIG. 14 is a section on the line 14—14 of FIG. 13.

*FIGS. 13 and 14*

The finished product shown in FIGS. 13 and 14 is obtained by etching out the selectively etchable material 26 forming image 24/24' with an etching fluid. The etching fluid may be chromic-sulfuric acid which will dissolve etchable material 26 when composed of copper but will not affect the etch-resistant material 25 and 28 when composed of nickel. Various other etching fluids are known and may be employed depending upon the chemical properties of the materials making up the various layers of the screen.

As indicated herein various etch-resistant and etchable metals may be employed in the practice of this invention for the fabrication of the precision masks or screens described. Suitable combinations of etch-resistant metal and etchable metal include gold (etch-resistant) and copper (etchable). Suitable etching fluids for this combination of metals include aqueous solutions of ferric chloride, ammonium persulfate and chromic-sulfuric acid. Another combination of metals includes gold (etch-resistant) and nickel (etch-resistant). Aqueous ferric chloride is a suitable etching fluid for this combination of metals. A metal particularly useful as the etch-resistant metal in the practice of this invention is rhodium which is impervious to most common etching fluids. Various other combinations of etch-resistant metals and etchable metals are known to the art and are suitable for use in the practice of this invention in combination with suitable known etching fluids.

Further, any of the commercially available photo resist materials of the group of photographic materials which usually include a resist developer, resist, resist thinner and a dye and which undergo a change in solubility characteristics upon exposure to light may be employed in the practice of this invention. Suitable photo resist materials are commercially available from and are sold under the trademarks KPR and KMER.

The method of preparing precision screens and masks by electroforming and selective etching in accordance with this invention can be used with any combination of metals which can be electroformed and selectively etched. The final surface finish obtained is dependent on the finish of the substrate 20 coated with conductive material 21.

The precision obtained is limited only by the accuracy of the master negative from which image 24/24' is obtained and the resistance of etch-resistant material 25 and 28 to the etching fluid used for etching.

Although the invention has been described in its preferred form with a certain degree of particularity, it is understood that the present disclosure of the preferred form has been made by way of example and that numerous changes in the details of construction and the combination and arrangement of parts may be resorted to without departing from the spirit and the scope of the invention.

The embodiments of the invention in which an exclusive property or privilege is claimed are defined as follows:

1. The method of preparing precision screens and masks which comprises:

(a) coating a substrate having an electrically conductive surface with a first layer of photo resist material, (b) developing a first image on said photo resist material and removing unexposed portions of said photo resist material from said substrate, (c) electrodepositing a first layer of selectively etch-resistant first material on said substrate where said selected portions of said photo resist material have been removed, (d) removing the remaining portion of said first layer of photo resist material, (e) electroplating a selectively etchable second material on said etch-resistant material to completely cover said etch-resistant first material and that space previously occupied by said remaining portion of photo resist material removed hereinabove, said second material being selectively etchable with respect to said first material and to the third material mentioned hereinbelow, (f) coating said etchable second material with a second layer of photo resist material, (g) developing on said second layer of photo resist material in alignment with said first image, a second image corresponding to and coextensive in design and area with respect to said first image and removing the unexposed portions of photo resist material, (h) electroplating as a second layer selectively etch-resistant third material on said etchable second material where said unexposed portions of photo resist material have been removed from said second layer of photo resist material, (i) removing the remaining exposed portion of said second layer of photo resist, and (j) etching said etchable second material with etching fluid to conjoin said first and second images.

2. The method of preparing precision screens and masks of claim 1 in which said first and second layers of etch-resistant materials are electrodeposited to a thickness of between 0.0005 and 0.0010 of an inch.

3. The method of preparing precision screens and masks in accordance with claim 1 wherein said first and second layers of etch-resistant materials are electro-deposited to a thickness not greater than the thickness of said first and second layers of photo resist material, respectively.

4. The method of preparing precision screens and masks of claim 1 in which said etchable second material is electroplated to a thickness of between 0.001 and 0.010 of an inch.

5. The method of preparing precision screens and masks of claim 1 in which said etchable second material is copper.

6. The method of preparing precision screens and masks of claim 1 in which said etch-resistant first and third material is nickel.

7. The method of preparing precision screens and masks of claim 1 in which said etchable second material is copper and said etch-resistant first and third material is nickel.

References Cited by the Examiner

UNITED STATES PATENTS

| | | | |
|---|---|---|---|
| 2,469,689 | 5/49 | Gresham | 204—11 |
| 2,558,504 | 6/51 | Aller | 204—143 |
| 2,762,149 | 9/56 | Mears | 96—35 |
| 2,829,460 | 4/58 | Golay | 96—36 |
| 2,895,814 | 7/59 | Clark | 204—143 |

JOHN H. MACK, *Primary Examiner.*

MURRAY TILLMAN, *Examiner.*